(12) United States Patent
Petti

(10) Patent No.: US 7,521,353 B2
(45) Date of Patent: Apr. 21, 2009

(54) METHOD FOR REDUCING DIELECTRIC OVERETCH WHEN MAKING CONTACT TO CONDUCTIVE FEATURES

(75) Inventor: Christopher J Petti, Mountain View, CA (US)

(73) Assignee: Sandisk 3D LLC, Milpitas, CA (US)

( * ) Notice: Subject to any disclaimer, the term of this patent is extended or adjusted under 35 U.S.C. 154(b) by 176 days.

(21) Appl. No.: 11/089,771

(22) Filed: Mar. 25, 2005

(65) Prior Publication Data

US 2006/0216931 A1 Sep. 28, 2006

(51) Int. Cl.
*H01L 21/4763* (2006.01)
*H01L 21/461* (2006.01)
*H01L 21/302* (2006.01)

(52) U.S. Cl. .................. 438/623; 438/624; 438/692; 257/E21.027

(58) Field of Classification Search .................. 438/645, 438/638, 623, 624, 692, 629; 257/E21.027, 257/E21.035, E21.576
See application file for complete search history.

(56) References Cited

U.S. PATENT DOCUMENTS

| | | | |
|---|---|---|---|
| 4,646,266 | A | 2/1987 | Ovshinsky et al. |
| 5,244,837 | A | 9/1993 | Dennison |
| 5,612,254 | A | 3/1997 | Mu et al. |
| 5,926,732 | A | 7/1999 | Matsuura |
| 6,072,237 | A | 6/2000 | Jang et al. |
| 6,162,722 | A | 12/2000 | Hsu |
| 6,258,712 | B1 | 7/2001 | Wang |
| 6,313,018 | B1 | 11/2001 | Wang et al. |
| 6,472,308 | B1 | 10/2002 | Mehta |
| 6,952,030 | B2 | 10/2005 | Herner et al. |
| 7,063,597 | B2 | 6/2006 | Prabhu et al. |
| 2003/0057457 | A1* | 3/2003 | Yamada et al. .............. 257/249 |
| 2003/0109123 | A1 | 6/2003 | Orita |
| 2005/0012119 | A1 | 1/2005 | Herner et al. |
| 2005/0012120 | A1 | 1/2005 | Herner et al. |
| 2005/0012154 | A1 | 1/2005 | Herner et al. |
| 2005/0012220 | A1 | 1/2005 | Vyvoda et al. |
| 2005/0014322 | A1 | 1/2005 | Herner et al. |
| 2005/0014334 | A1 | 1/2005 | Herner et al. |
| 2005/0029664 | A1* | 2/2005 | Cho et al. .................... 257/758 |
| 2005/0052915 | A1 | 3/2005 | Herner et al. |
| 2005/0130352 | A1* | 6/2005 | Maldei et al. ............... 438/128 |

FOREIGN PATENT DOCUMENTS

| WO | WO 99/16118 A1 | 4/1999 |
|---|---|---|
| WO | WO 2004/061851 A2 | 7/2004 |

\* cited by examiner

*Primary Examiner*—Walter Lindsay, Jr.
(74) *Attorney, Agent, or Firm*—Dugan & Dugan, PC

(57) ABSTRACT

In a first preferred embodiment of the present invention, conductive features are formed on a first dielectric etch stop layer, and a second dielectric material is deposited over and between the conductive features. A via etch to the conductive features which is selective between the first and second dielectrics will stop on the dielectric etch stop layer, limiting overetch. In a second embodiment, a plurality of conductive features is formed in a subtractive pattern and etch process, filled with a dielectric fill, and then a surface formed coexposing the conductive features and dielectric fill. A dielectric etch stop layer is deposited on the surface, then a third dielectric covers the dielectric etch stop layer. When a contact is etched through the third dielectric, this selective etch stops on the dielectric etch stop layer. A second etch makes contact to the conductive features.

36 Claims, 9 Drawing Sheets

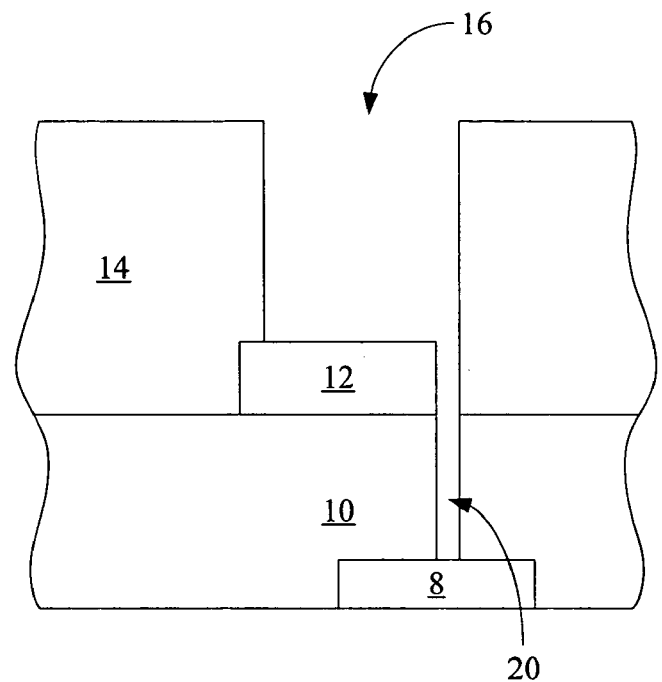
Fig. 1c
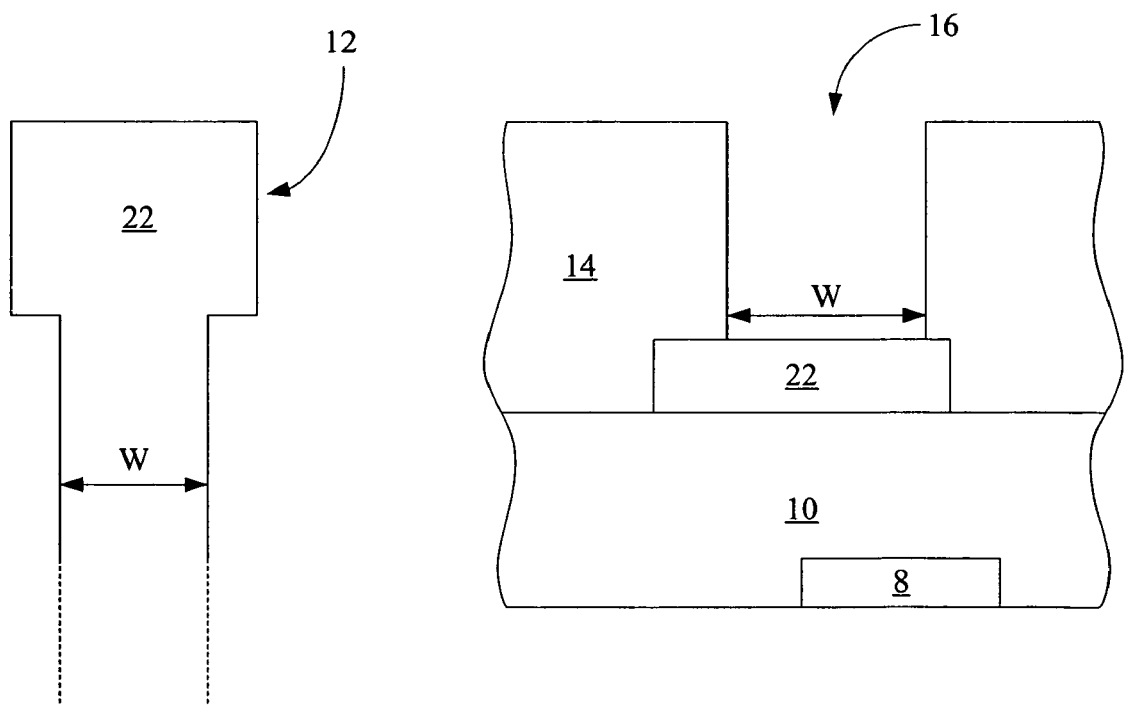
Fig. 2a                                Fig. 2b

METHOD FOR REDUCING DIELECTRIC OVERETCH WHEN MAKING CONTACT TO CONDUCTIVE FEATURES

RELATED APPLICATIONS

This application is related to Dunton et al., "Method for Reducing Dielectric Overetch Using a Dielectric Etch Stop at a Planar Surface," U.S. application Ser. No. 11/090,526, filed on even date herewith and hereby incorporated by reference.

BACKGROUND OF THE INVENTION

The invention relates to a method for reducing dielectric overetch when making contact to conductive features. The method makes use of etch selectivities between different dielectric materials.

In semiconductor devices, it is known to etch through a dielectric material to make electrical contact, for example by way of a via, to a conductive feature such as a line which is covered by the dielectric material. Once the void is etched and a portion of the conductive line is exposed, it is filled with a conductive material such as tungsten.

The etch is ideally aligned with the buried conductive feature. The etchant is generally selective between the dielectric material being etched and the material of the conductive feature, and thus will stop when the conductive feature is reached. If the etch is misaligned, some portion of the etched region may not fall on the conductive feature, instead continuing past the conductive feature into fill dielectric, and excessive overetch may occur in this misaligned region. This overetch may reach a conductive feature on another level, causing an undesired electrical short when the via is filled. To avoid excessive overetch due to misalignment, it is usual to widen the conductive feature in the region where the contact is to be made, forming a wider area, sometimes called a landing pad.

Use of a wider landing pad in dense arrays may decrease device density, however. It is desirable, therefore, to etch through dielectric material to form electrical contacts to buried conductive features without compromising density or risking excessive overetch.

SUMMARY OF THE PREFERRED EMBODIMENTS

The present invention is defined by the following claims, and nothing in this section should be taken as a limitation on those claims. In general, the invention is directed to a method to prevent excessive dielectric overetch when forming contact to conductive features.

A first aspect of the invention provides for a method for reducing dielectric overetch, the method comprising: depositing a layer or stack of conductive or semiconductor material; patterning and etching the layer or stack of conductive or semiconductor material to form a plurality of conductive or semiconductor features; depositing a layer of a first dielectric material directly on a substantially planar surface; depositing a second dielectric material above the conductive or semiconductor features, wherein the first dielectric layer is above or below the conductive or semiconductor features; etching a void in the second dielectric material wherein the etch is selective between the first and the second dielectric material and the etch stops on the first material; and exposing a portion of the conductive or semiconductor features.

Another aspect of the invention provides for a method for reducing dielectric overetch, the method comprising: forming a layer of a first dielectric material; forming conductive or semiconductor features above and in contact with the first dielectric material; depositing a second dielectric material above and contacting the conductive or semiconductor features; etching a void in the second dielectric material, wherein the etch is selective between the first and second dielectric material, and the etch stops on the first dielectric material; and exposing a portion of the conductive or semiconductor features.

A preferred embodiment provides for a method for reducing dielectric overetch, the method comprising: depositing a layer or stack of conductive or semiconductor material; patterning and etching the layer or stack of conductive or semiconductor material to form conductive or semiconductor features; depositing first dielectric fill over and between the conductive or semiconductor features; planarizing to coexpose the first dielectric fill and the conductive or semiconductor features, forming a substantially planar surface; depositing a dielectric etch stop layer directly on the planar surface; depositing second dielectric material on the dielectric etch stop layer; etching a void in the second dielectric material, wherein the etch is selective between the second dielectric material and the dielectric etch stop layer, wherein the etch stops on the dielectric etch stop layer; and etching a portion of the dielectric etch stop layer to expose portions of the conductive or semiconductor features.

Another aspect of the invention provides for a method for reducing dielectric overetch, the method comprising: depositing a layer or stack of conductive or semiconductor material above a substrate; patterning and etching the conductive or semiconductor material to form a plurality of conductive or semiconductor features separated by gaps; filling the gaps with a first dielectric fill; depositing a second dielectric material directly on the first dielectric fill; depositing a third dielectric material above the conductive or semiconductor features; etching a void in the third dielectric material, wherein the etch is selective between the third dielectric material and the second dielectric material and the etch stops on the second dielectric material; and exposing a portion of the conductive or semiconductor feature.

Another preferred embodiment of the invention provides for a method for forming a via connecting device levels in a monolithic three dimensional array, the method comprising: forming first conductive features in a first device level above a substrate; forming a first dielectric etch stop layer in contact with the first conductive features; depositing a second dielectric material above the first conductive features; etching a void in the second dielectric material, wherein the etch is selective between the first dielectric material and the second dielectric material, wherein the etch stops on the first dielectric material; exposing a portion of the first conductive features; forming the via within the void, the via making electrical connection to one of the first conductive features; and monolithically forming at least a second device level above the first device level.

Yet another aspect of the invention provides for a method for forming a via connecting device levels in a monolithic three dimensional array, the method comprising: forming first conductive features at a first height above a substrate; forming a first dielectric etch stop layer in contact with the first conductive features; depositing a second dielectric material above the first conductive features; etching a void in the second dielectric material, wherein the etch is selective between the first dielectric material and the second dielectric material, wherein the etch stops on the first dielectric material; exposing a portion of the first conductive features; forming the via within the void, the via making electrical connection to one of the first conductive features; monolithically forming a first device level at a second height above the first height; and monolithically forming a second device level above the first device level.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIGS. 1a-1c are cross-sectional views illustrating how undesirable dielectric overetch may occur when a contact etch is misaligned.

FIG. 2a is a plan view illustrating prevention of dielectric overetch by use of a widened "landing pad". FIG. 2b is a cross-sectional view of such a landing pad.

DETAILED DESCRIPTION OF THE PREFERRED EMBODIMENTS

Figure 1A:
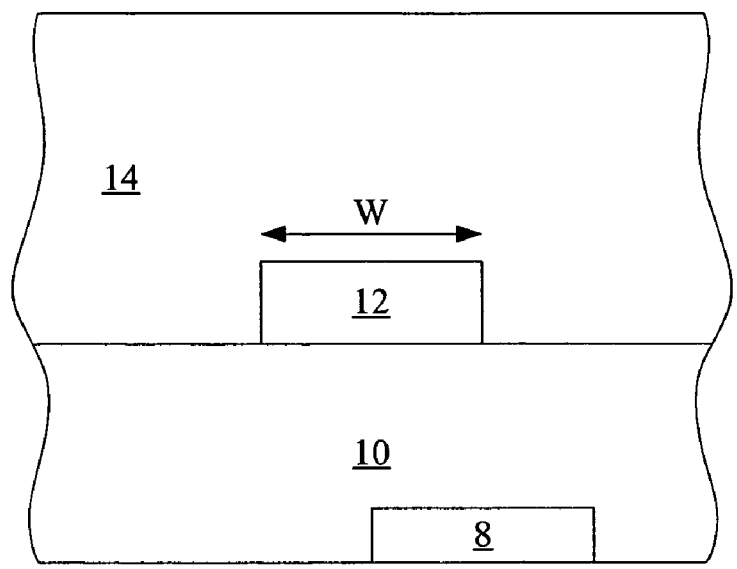

In semiconductor devices it is often necessary to make electrical connection to a conductor when the conductor has been covered by a dielectric material. Turning to FIG. 1a, suppose, for example, that a via is to be formed making electrical connection to metal conductor 12. Metal conductor 12 is formed on a dielectric 10, then covered with dielectric 14. Conductor 8 is formed at a lower level. Silicon dioxide is a frequently used high-quality dielectric. In this example, suppose dielectrics 10 and 14 are both silicon dioxide.

The width W of metal conductor 12 may be the feature size, the minimum size of a patterned feature or gap that can be formed in a semiconductor device. The feature size is limited by photolithographic and other constraints. It is generally desirable to maximize density in semiconductor devices.

Figure 1B:
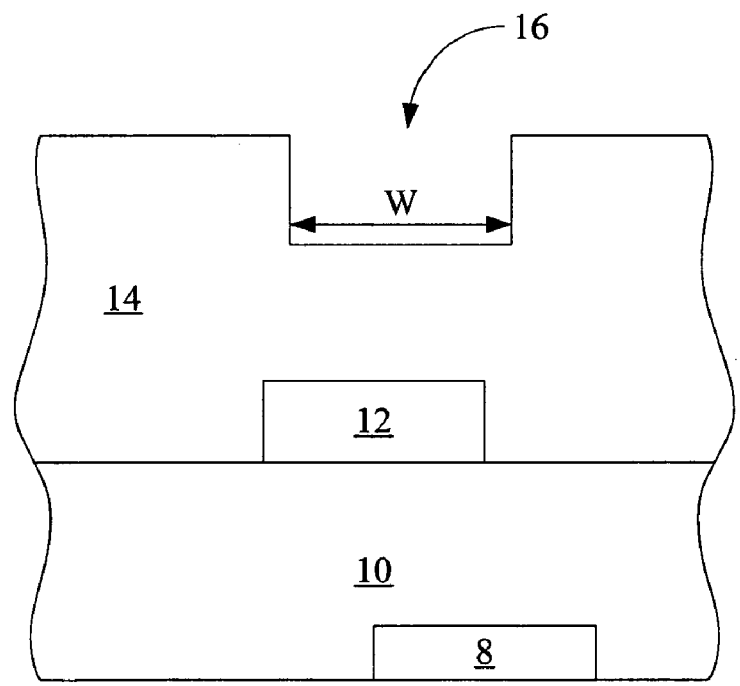

FIG. 1b shows early stages of an etch step in which a void 16 is etched in dielectric 14. In this example the width of void 16 is also W, the feature size. It will be seen that void 16 and metal conductor 12 are slightly misaligned.

As the etch continues, as shown in FIG. 1c, the etch reaches metal conductor 12. The etchant is chosen to be selective, such that the etch stops at metal conductor 12, and metal conductor 12 itself is etched minimally or not at all. Due to slight misalignment, however, a portion of the etch does not fall on metal conductor 12, and the etch continues, creating a deep overetch 20. This overetch reaches to conductor 8, and will form a short between conductors 8 and 12 when void 16 is filled with a conductive material. The danger of excessive overetch occurring may be particularly acute if the height of metal conductor 12 is very small.

The most common way to avoid a deep overetch is to widen metal conductor 12 at the point where contact is to be made. FIG. 2a shows a plan view of metal conductor 12, which has width W for its length, and a wider landing pad 22 where contact is to be made. FIG. 2b shows the etch of FIG. 1c; it will be seen that the increased width of the landing pad 22 allows for some misalignment with no resulting overetch.

Figure 3A:
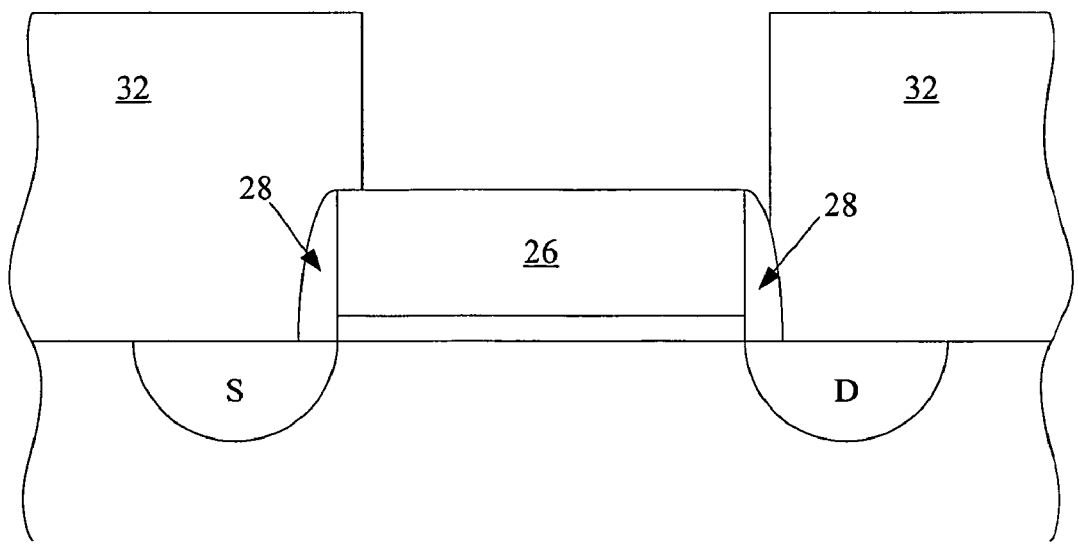
FIG. 3a is a cross-sectional view of the use of dielectric spacers to prevent dielectric overetch.
Figure 3B:
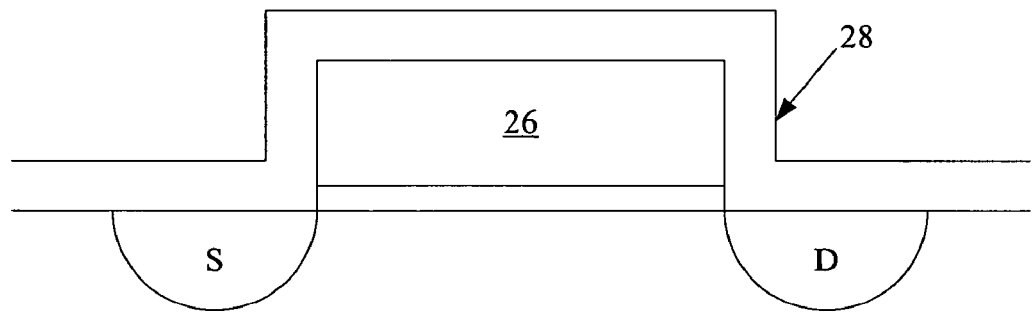
FIGS. 3b and 3c are cross-sectional views illustrating formation of dielectric spacers.
Figure 3C:
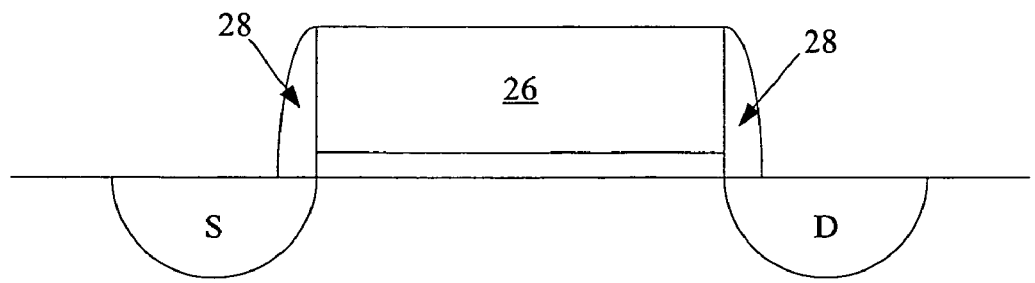

Another way of improving misalignment tolerance during a contact etch is to form spacers. For example, as shown in FIG. 3a, a transistor is formed having a polysilicon gate 26 and dielectric spacers 28. (S and D indicate source and drain of the transistor.) Spacers 28 can be formed, as shown in FIG. 3b, by depositing a thin layer 28 of a different dielectric material, for example silicon nitride, over polysilicon gate 26. (In this discussion, polycrystalline silicon will be referred to as polysilicon.) An anisotropic etch follows, which preferentially etches vertically, with very little or no side-etching. After the anisotropic etch, silicon nitride is removed from horizontal surfaces, remaining only in spacers 28, as shown in FIG. 3c. Returning to FIG. 3a, silicon dioxide 32 covers polysilicon gate 26. When an etch is performed to form a contact to gate 26, the etch may be slightly misaligned, as shown. Spacers 28, though, effectively widen the gate, and etchants may be used that are highly selective, etching silicon dioxide 32 at a high rate, while etching both silicon nitride spacers 28 and polysilicon gate 26 at a very low rate.

In a tightly-packed set of conductive lines, however, inclusion of a landing pad or dielectric spacers on each line increases the pitch at which the lines can be formed, decreasing density. (Pitch is the distance between adjacent occurrences of the same feature in a repeating pattern, for example the distance from the center of one line to the center of the next line.)

Such a set of tight-pitch conductive lines is formed in, for example, the monolithic three dimensional memory array of Herner et al., U.S. patent application Ser. No. 10/326,470, "An Improved Method for Making High Density Nonvolatile Memory," filed Dec. 19, 2002, since abandoned, hereinafter the '470 application and hereby incorporated by reference. Related memories are described in Herner, U.S. patent application Ser. No. 10/955,549, "Nonvolatile Memory Cell Without a Dielectric Antifuse Having High- and Low-Impedance States," filed Sep. 29, 2004, hereinafter the '549 application; in Herner et al. U.S. patent application Ser. No. 10/954,577, "Junction Diode Comprising Varying Semiconductor Compositions," filed Sep. 29, 2004, hereinafter the '577 application; and in Herner et al., U.S. patent application Ser. No. 11/015,824, "Nonvolatile Memory Cell Comprising a Reduced Height Vertical Diode," filed Dec. 17, 2004, all hereby incorporated by reference. The problem of making contact to conductors formed at tight pitch is particularly acute in these memories, where electrical connections must be formed between multiple memory levels.

The methods of the present invention allow electrical contact to be made to a conductive feature covered by dielectric with no necessity for a landing pad, spacers, or any other method requiring a decrease in density.

Figure 4A:
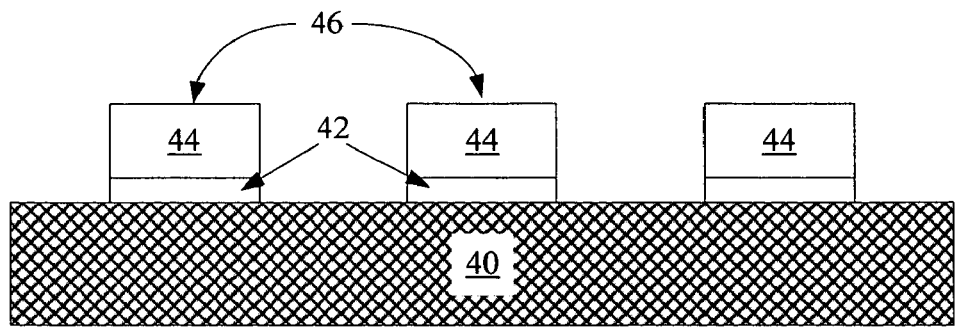
FIGS. 4a-4c are cross-sectional views illustrating use of a dielectric etch stop layer to reduce dielectric overetch according to a preferred embodiment of the present invention.

Turning to FIG. 4a, formation begins on a dielectric material 40, for example silicon nitride. Some conductive material 44 is deposited above silicon nitride 40. In this example, conductive material 44 will be described as tungsten, though it will be understood that other conductive materials, such as metals, metal nitrides, metal suicides, doped semiconductor, etc., may be used instead. An adhesion layer 42, for example of titanium nitride, may intervene between tungsten layer 44 and silicon nitride layer 40. Tungsten layer 44 and titanium nitride layer 42 are then patterned and etched to form conductive features 46, in this example a set of fine pitch lines shown in cross-section. Some small amount of overetch may take place, creating some recess into silicon nitride layer 40 (not shown.)

Figure 4B:
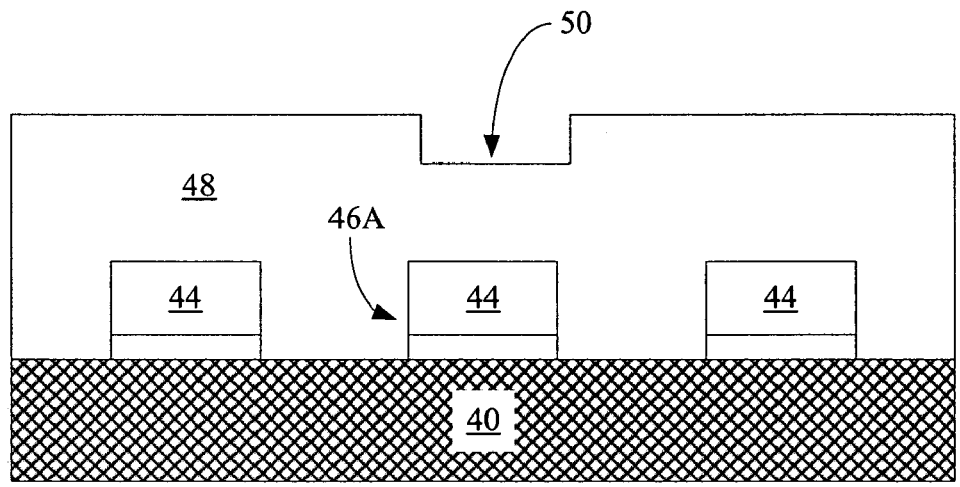

Next, turning to FIG. 4b, a dielectric material 48, preferably silicon dioxide, is deposited over and between lines 46, filling gaps between them and covering them. An etch is begun to form void 50, in which an electrical contact will be formed, making electrical connection to one of the lines, 46A. It will be seen that void 50 and line 46A are slightly misaligned.

Figure 4C:
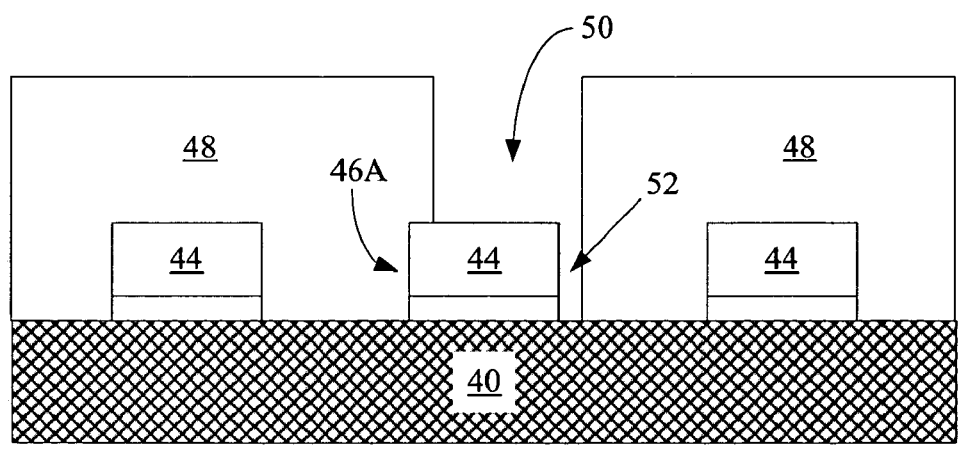

FIG. 4c shows the structure when the etch of void 50 has been completed. An etchant was used that is selective between silicon dioxide 48 and the tungsten of line 46A, and also selective between silicon dioxide 48 and silicon nitride layer 40. The etch thus will stop when it reaches either of these layers. In case of misalignment there will be a limited amount of overetch 52. The overetch 52, however, stops in silicon nitride layer 40, and thus is guaranteed not to reach to an underlying conductive layer, causing an undesired electrical short.

Many variations are possible which fall within the scope of the invention. In the example given, first dielectric layer 40 is silicon nitride while the second dielectric material 48 is silicon dioxide. These materials can be reversed, or a different dielectric material can be used for either layer, for example silicon oxynitride, silicon carbon, undoped amorphous or polycrystalline silicon, among many others. The only requirement is that there be some degree of etch selectivity between the two dielectric materials.

Figure 4D:
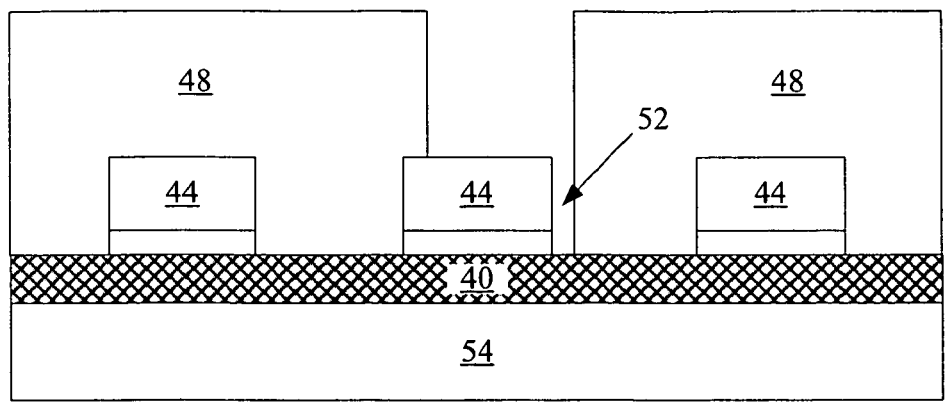
FIG. 4d is a cross-sectional view of an alternate embodiment of the present invention.

In FIGS. 4a-4c, silicon nitride layer 40 appeared relatively thick. This thick layer can be replaced with a thinner layer, as shown in FIG. 4d, which is formed over some other thicker dielectric 54, for example silicon dioxide. Layer 40 is preferably between about 200 and about 1200 angstroms, most preferably between about 700 and about 800 angstroms. For the embodiment just described, it is preferred that the dielectrics, etchant, and etch conditions be selected such that etch selectivity between dielectric 48 (silicon dioxide in this example) and dielectric 40 (silicon nitride in this example) is at least about 4:1.

The example of FIGS. 4a-4c described formation of tungsten lines 46 by a subtractive method: In such a method, conductive material is deposited, patterned and etched to form lines. If desired, lines 46 could be formed by a Damascene method instead.

In the embodiment just described, dielectric overetch is reduced by a method, the method comprising forming a layer of a first dielectric material; forming conductive or semiconductor features above and in contact with the first dielectric material; depositing a second dielectric material above and contacting the conductive or semiconductor features; etching a void in the second dielectric material, wherein the etch is selective between the first and second dielectric material, and the etch stops on the first dielectric material; and exposing a portion of the conductive or semiconductor features.

The conductive features of the example are tight-pitch lines; clearly any other shapes could be formed instead.

Figure 5A:
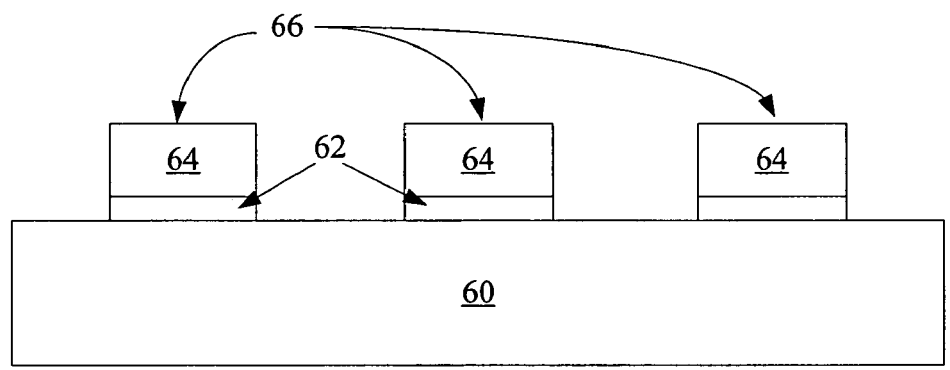
FIGS. 5a-5c are cross-sectional views illustrating use of a dielectric etch stop layer to reduce dielectric overetch according to another preferred embodiment of the present invention.
Figure 5B:
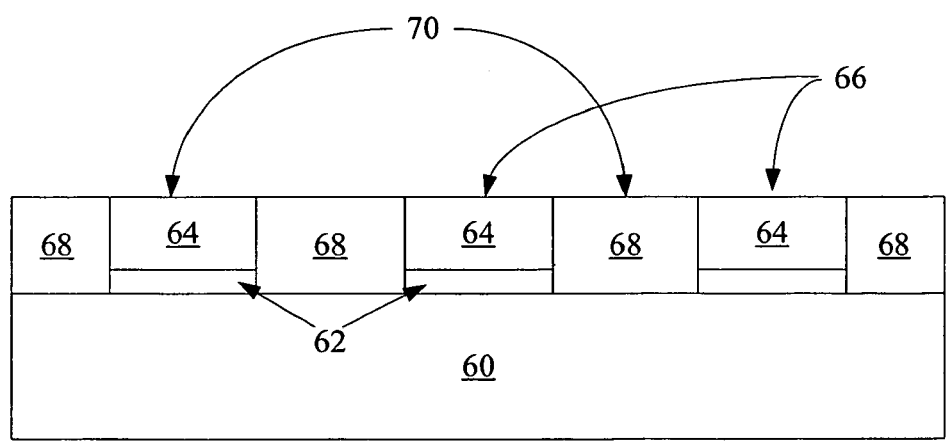
Figure 5C:
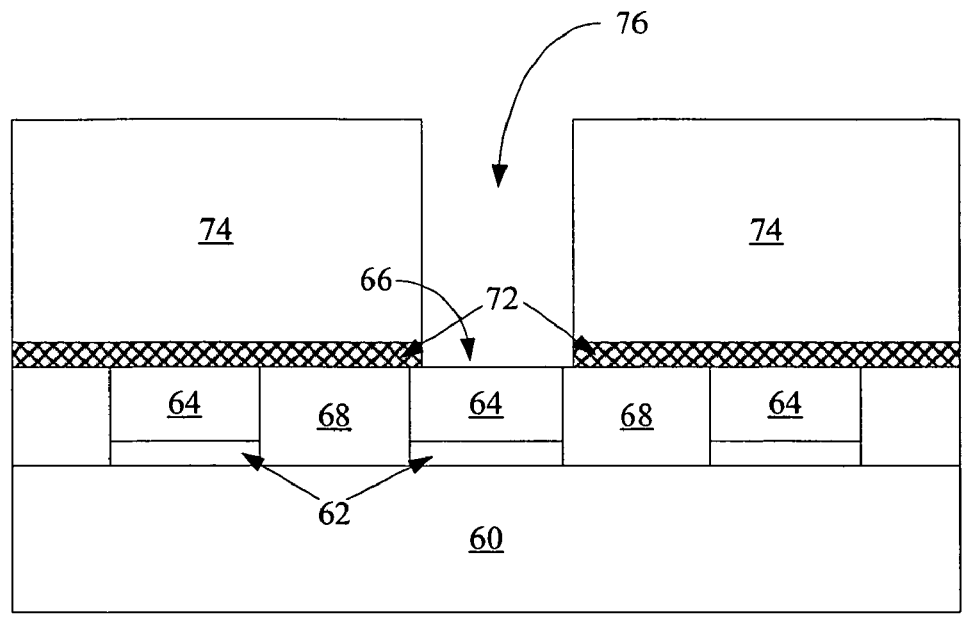

FIGS. 5a-5c illustrate an alternative embodiment. Fabrication begins on a dielectric material 60, preferably silicon dioxide. A conductive material or stack is deposited on dielectric material 60, for example titanium nitride layer 62 and tungsten layer 64 (clearly other conductive materials or stacks can be used.) Tungsten layer 64 and titanium nitride layer 62 are then patterned and etched into conductive patterned features 66, in this example lines. The resulting structure at this point is shown in FIG. 5a.

Next, as shown in FIG. 5b, a dielectric fill material 68, preferably silicon dioxide, is deposited over and between lines 66, filling the gaps between them. A planarization step, for example by chemical mechanical planarization (CMP), is performed next, removing the overfill of silicon dioxide 68, coexposing lines 66 and silicon dioxide 68 and forming a substantially planar surface 70. The resulting structure at this point is shown in FIG. 5b.

Turning to FIG. 5c, next a thin dielectric etch stop layer 72, preferably silicon nitride, is deposited on substantially planar surface 70. This layer is between about 100 and about 1000 angstroms thick, preferably about 500 angstroms thick. Finally a dielectric material 74, preferably silicon dioxide, is deposited on silicon nitride etch stop layer 72. An etch step is performed to etch a void 76 in silicon dioxide 74 to make contact to the tungsten layer 64 of one of the lines 66. As shown, there may be some misalignment. The etch stops on silicon nitride etch stop layer 72. A second etch is performed to etch away silicon nitride etch stop layer 72, exposing the top of line 66, as shown. In the misaligned region, the silicon nitride etch will stop on silicon dioxide fill 68. For the embodiment just described, it is preferred that the dielectrics, etchant, and etch conditions be selected such that etch selectivity is between dielectric 74 (silicon dioxide in this example) and dielectric 72 (silicon nitride in this example) be at least about 6:1.

In the embodiment just described, dielectric overetch is limited by a method, the method comprising depositing a layer or stack of conductive or semiconductor material; patterning and etching the layer or stack of conductive or semiconductor material to form conductive or semiconductor features; depositing first dielectric fill over and between the conductive or semiconductor features; planarizing to coexpose the first dielectric fill and the conductive or semiconductor features, forming a substantially planar surface; depositing a dielectric etch stop layer directly on the planar surface; depositing second dielectric material on the dielectric etch stop layer; etching a void in the second dielectric material, wherein the etch is selective between the second dielectric material and the dielectric etch stop layer, wherein the etch stops on the dielectric etch stop layer; and etching a portion of the dielectric etch stop layer to expose portions of the conductive or semiconductor features.

In the exemplary embodiments just described, the conductive features were made of metal. Any conductive material, for example a doped semiconductor material or a conductive silicide or nitride, could be used instead. Such materials can be deposited alone or in a stack.

To summarize, then, each of the embodiments described is a method for reducing dielectric overetch, the method comprising depositing a layer or stack of conductive or semiconductor material; patterning and etching the layer or stack of conductive or semiconductor material to form a plurality of conductive or semiconductor features; depositing a layer of a first dielectric material directly on a substantially planar surface; depositing a second dielectric material above the conductive or semiconductor features, wherein the first dielectric layer is above or below the conductive or semiconductor features; etching a void in the second dielectric material wherein the etch is selective between the first and the second dielectric material and the etch stops on the first material; and exposing a portion of the conductive or semiconductor features.

An example will be given of a monolithic three dimensional memory array formed using embodiments of the present invention to prevent excessive dielectric overetch during formation of electrical contact to tungsten conductors. For completeness, this example will include many details, including materials, dimensions, conditions, and process steps. It will be understood by those skilled in the art that many of these details can be modified, augmented, or omitted while the results still fall within the scope of the invention. This example is provided as an illustration only.

The monolithic three dimensional memory array to be described is similar to that described in the '470 application, the '549 application, and the '577 application. For simplicity and to avoid obscuring the invention, not all of the detail provided in those applications is included. It will be understood, however, that no teaching of any of the '470 application, the '549 application, or the '577 application is intended to be excluded.

EXAMPLE

Fabrication of a single memory level is described. Additional memory levels can be stacked, each monolithically formed above the one below it.

Figure 6A:
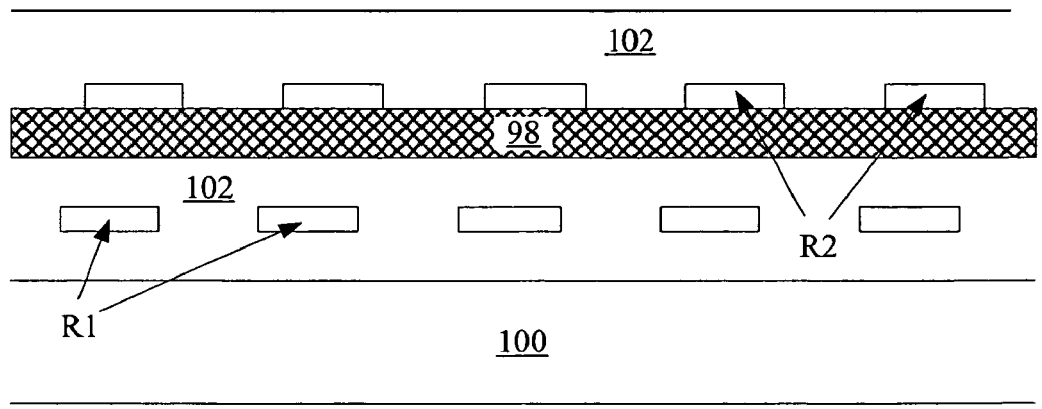
FIGS. 6a-6d are cross-sectional views illustrating formation of a portion of a first memory level in a monolithic three dimensional memory array wherein a dielectric etch stop layer is used according to the methods of the present invention to reduce dielectric overetch.

Turning to FIG. 6a, formation of the memory begins with a substrate 100. This substrate 100 can be any semiconducting substrate as known in the art, such as monocrystalline silicon, IV-IV alloys like silicon-germanium or silicon-germanium-carbon, III-V alloys, II-VII alloys, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material. In this example, insulating layer 102 is silicon dioxide, and this layer is, for example, about 3000 angstroms thick.

A first routing layer including conductors R1 is formed, and is covered with additional dielectric 102. A second routing layer of conductors R2 will be formed as well.

Before formation of conductors R2, however, a dielectric etch stop layer 98 is deposited on insulating layer 102. Dielectric etch stop layer 98 is preferably silicon nitride, though other dielectric materials can be used instead. Dielectric etch stop layer 98 is between about 200 angstroms thick and about 1200 angstroms thick, preferably between about 700 and about 800 angstroms thick. Conductors R2 are formed on dielectric etch stop layer 98. During the step of etching conductors R2, some overetch into silicon nitride layer 98 may take place. For simplicity, this overetch is not shown. Additional insulating material 102 is deposited between conductors R2 and over them. FIG. 6a shows the structure as it appears at this point.

Figure 6B:
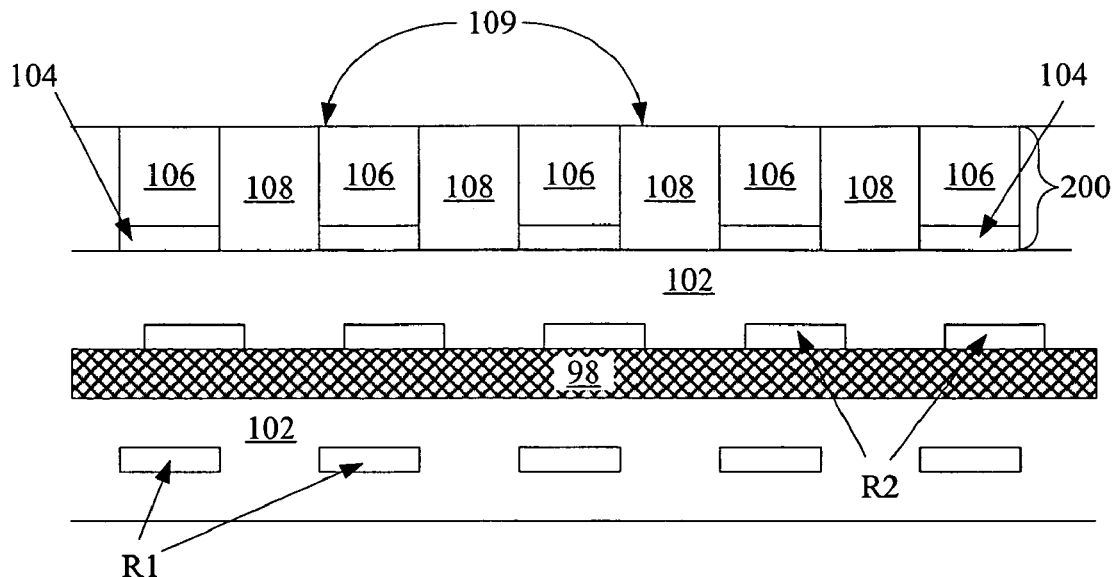

Turning to FIG. 6b, the first conductors 200 are formed over insulating layer 102. An adhesion layer 104 may be included between insulating layer 102 and the conducting layer 106 to help the conducting layer 106 adhere. Preferred materials for the adhesion layer 104 are tantalum nitride, tungsten nitride, titanium tungsten, sputtered tungsten, titanium nitride, or combinations of these materials. If the overlying conducting layer 106 is tungsten, titanium nitride is preferred for use in adhesion layer 104. Adhesion layer 104 is between about 20 and about 500 angstroms thick, preferably about 200 angstroms thick. (To save space substrate 100 is omitted in FIG. 6b and subsequent figures; its presence will be assumed.)

The next layer to be deposited is conducting layer 106. Conducting layer 106 can comprise any conducting material known in the art, including tantalum, titanium, tungsten, copper, cobalt, or alloys thereof. Titanium nitride may be used. Conducting layer is between about 200 and about 2000 angstroms thick, preferably about 1500 angstroms thick.

Once all the layers that will form the conductor rails have been deposited, the layers will be patterned and etched using any suitable masking and etching process to form substantially parallel, substantially coplanar conductors 200, shown in FIG. 6b in cross-section. In preferred embodiments, photoresist is deposited, patterned by photolithography and the layers etched, and then the photoresist removed using standard process techniques.

Next a dielectric material 108 is deposited over and between conductor rails 200. Dielectric material 108 can be any known electrically insulating material, such as silicon dioxide.

Finally, excess dielectric material 108 on top of conductor rails 200 is removed, exposing the tops of conductor rails 200 separated by dielectric material 108, and leaving a substantially planar surface 109. The resulting structure is shown in FIG. 6b. This removal of dielectric overfill to form planar surface 109 can be performed by any process known in the art, such as CMP or etchback. At this stage, a plurality of substantially parallel first conductors have been formed at a first height above substrate 100.

Figure 6C:
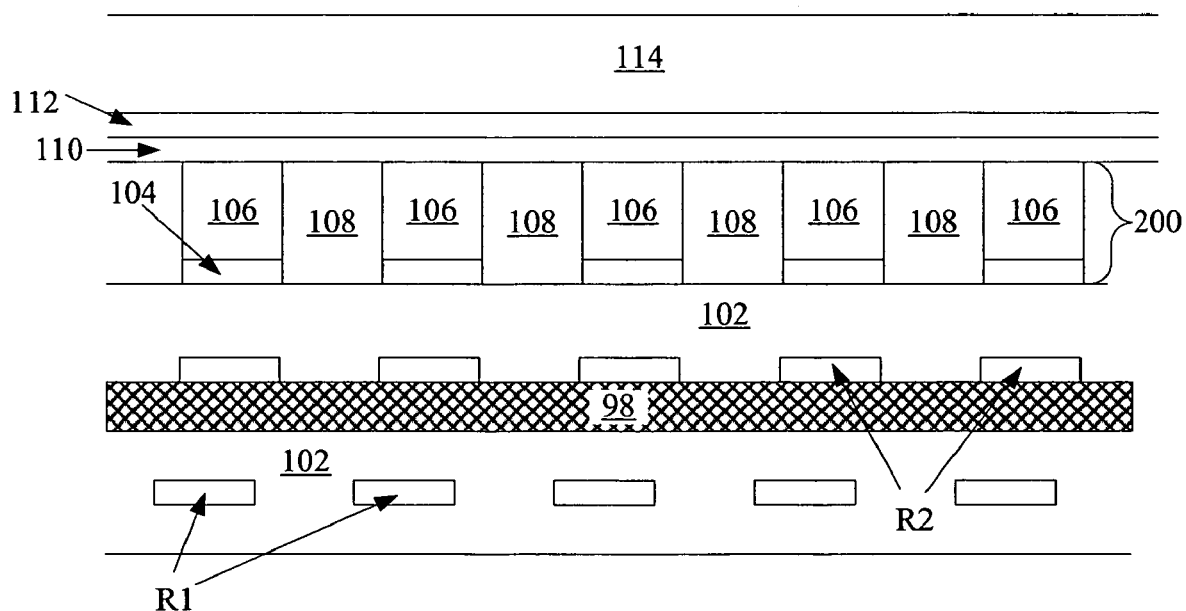

Next, turning to FIG. 6c, vertical semiconductor pillars will be formed above completed conductor rails 200. If conductive material 106 was tungsten, it is preferred to deposit barrier layer 110, preferably of titanium nitride, after planarization of the conductor rails 200. This layer can be formed in any conventional manner. Its thickness can be, for example, about 20 to about 500 angstroms. The thickness of barrier layer 110 is preferably about 200 angstroms.

Next semiconductor material that will be patterned into pillars is deposited. The semiconductor material can be silicon, silicon-germanium, silicon-germanium-carbon, germanium, or other suitable semiconductors or alloys. Silicon is commonly used in the industry, so, for simplicity, this description will refer to the semiconductor material as silicon, but it will be understood that other materials may be substituted.

Figures 7A, 7B:
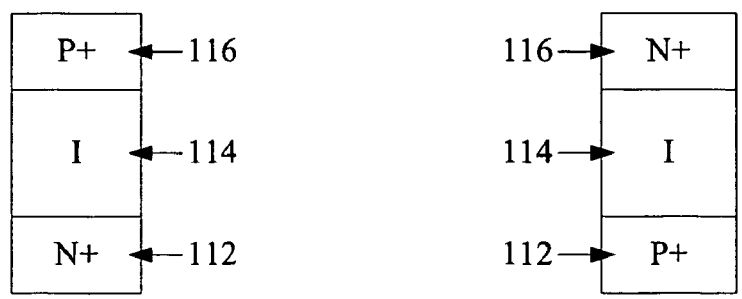
FIGS. 7a and 7b are cross-sectional views illustrating diode configurations that may be used in a memory cell in a monolithic three dimensional memory array.

In preferred embodiments, the semiconductor pillar is a junction diode, comprising a bottom heavily doped region of a first conductivity type and a top heavily doped region of a second conductivity type. The middle region, between the top and bottom regions, is an intrinsic or lightly doped region of either the first or second conductivity type. The diode of FIG. 7a has a bottom region 112 of N+ (heavily doped n-type) silicon, intrinsic region 114, and P+ top region 116. The diode of FIG. 7b is reversed, having bottom region 112 of P+ silicon, intrinsic region 114, and N+ top region 116. The middle region is intrinsic, or not intentionally doped, though in some embodiments it may be lightly doped. An undoped region will never be perfectly electrically neutral, and will always have defects or contaminants that cause it to behave as if slightly n-doped or p-doped. Such a diode can be considered a p-i-n diode.

Deposition and doping of layers 112, 114, and 116 can be achieved using many conventional methods, as described in the incorporated applications. In a preferred embodiment, heavily doped region 112 is formed by in situ doping with an n-type dopant such as phosphorus by flowing a donor gas during the silicon deposition. Once the desired thickness of layer 112 is formed, flow of the donor gas is stopped, and the rest of the desired thickness of silicon (the thicknesses of layer 114 and 116, in addition to a sacrificial thickness that will be lost in a following CMP step) is deposited undoped. In this preferred embodiment, heavily doped layer 116 is formed by an ion implantation step performed later, and thus has not yet been formed at this point and is not shown in FIG. 6c.

Figure 6D:
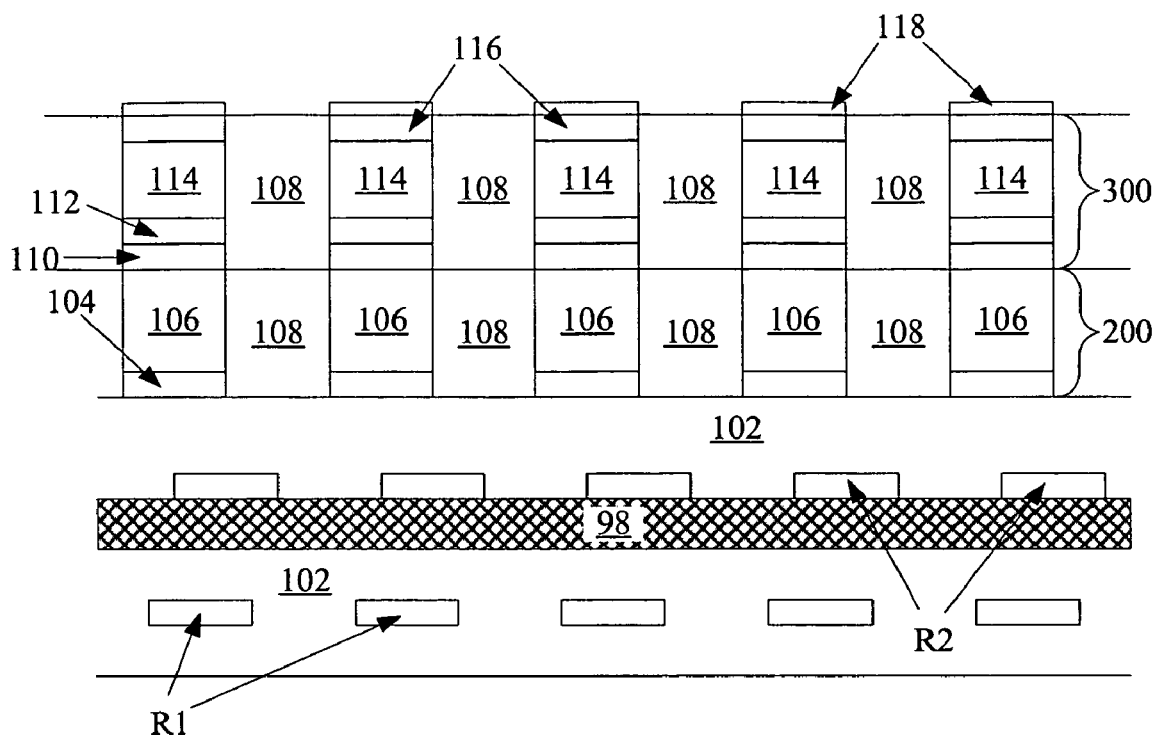

Turning to FIG. 6d, semiconductor layers 114 and 112 just deposited will be patterned and etched to form semiconductor pillars 300, along with barrier layer 110. Semiconductor pillars 300 should have about the same pitch and about the same width as conductors 200 below, such that each semiconductor pillar 300 is formed on top of a conductor 200. Some misalignment can be tolerated. The semiconductor pillars 300 can be formed using any suitable masking and etching process.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon dioxide.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. The ion implantation of heavily doped top regions 116 should be performed at this point, in this example using a p-type dopant to form P+ regions.

If desired a dielectric layer 118 which will function as a dielectric rupture antifuse can be formed on each pillar 300. This dielectric layer 118 can be formed by an oxidation method, for example by thermal or plasma oxidation. Alternatively the dielectric rupture antifuse can be deposited. The layer can silicon nitride, silicon oxide, silicon oxynitride, or any other suitable dielectric material. FIG. 6d shows the structure at this point.

Overlying conductors can be formed in the same manner as the underlying conductors. The overlying conductors will be formed at a height above the height of the first conductors, and extend in a different direction from them, preferably substantially perpendicular to them. Each memory cell comprises a portion of one of the first conductors, one of the first pillars, one of the dielectric rupture antifuses, and a portion of one of the second conductors. The resulting structure is a bottom or first level of memory cells. Additional memory levels can be monolithically formed above the first, as described in the '470 application and the other incorporated references, forming a monolithic three dimensional memory array. For example, a second plurality of pillars can be formed above the upper conductors, and a third plurality of conductors can be formed above them. The upper conductors of one memory level can serve as the lower conductors of an overlying memory level, or an interlevel dielectric can be formed between them.

Figure 8:
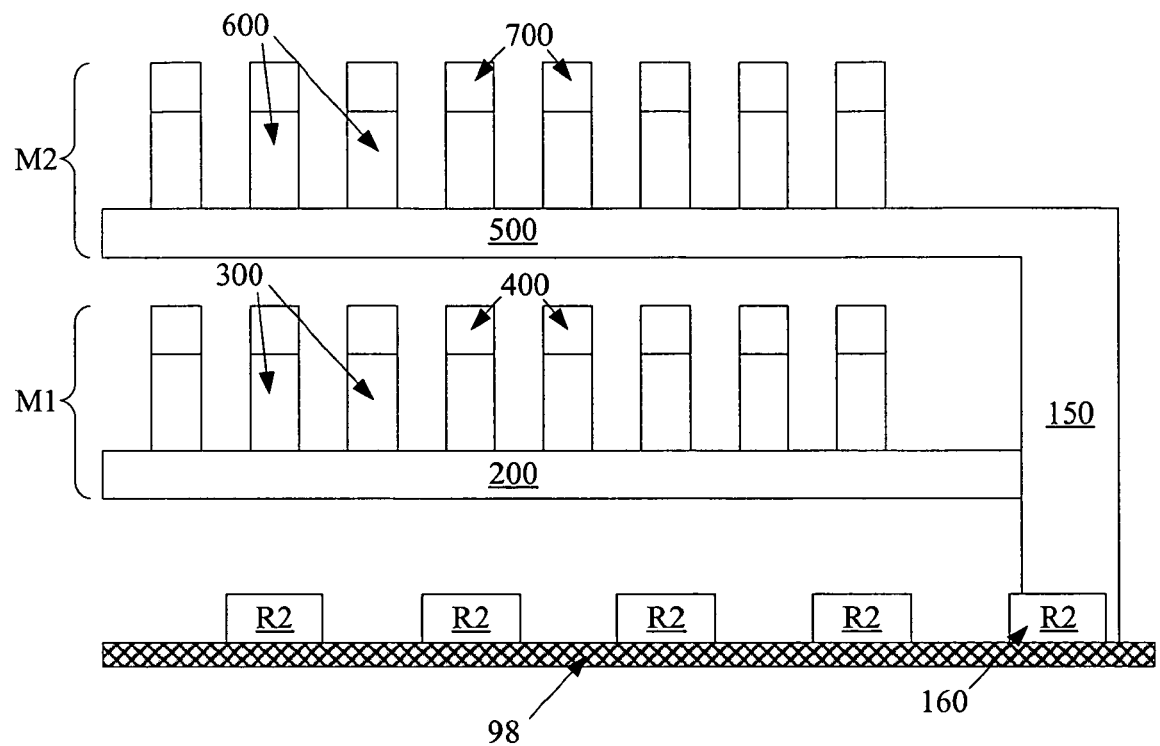
FIG. 8 is a cross-sectional view illustrating electrical connections formed between conductors in a monolithic three dimensional memory array in which the methods of the present invention are used to prevent overetch.

FIG. 8 shows a cross-sectional view of the array after two memory levels, M1 and M2, have been completed. First memory level M1 includes bottom conductors 200, pillars 300, and top conductors 400. Second memory level M2 includes bottom conductors 500, pillars 600, and top conductors 700. In the array shown, memory levels M1 and M2 do not share conductors. In reality, of course, each memory level will include many more memory cells than are shown in FIG. 8.

Electrical connection 150 must be made from bottom conductors 500 of memory level M2 to conductors R2 below the array. To form this connection, a void is etched in the intervening dielectric. The etch is intended to stop on conductor 160, one of the R2 conductors. The etch is performed, and, in case of misalignment, the etch will stop on dielectric etch stop layer 98, which was formed immediately beneath conductor 160. Thus this etch cannot continue, inadvertently making an unintended connection to an underlying layer.

The void is filled with a conductive material. In a preferred embodiment, the void is filled during the same deposition step in which bottom conductors 500 of memory level M2 are formed, and thus is formed of the same material. Bottom conductor 500 and via 150, then, are continuous.

Figure 9:
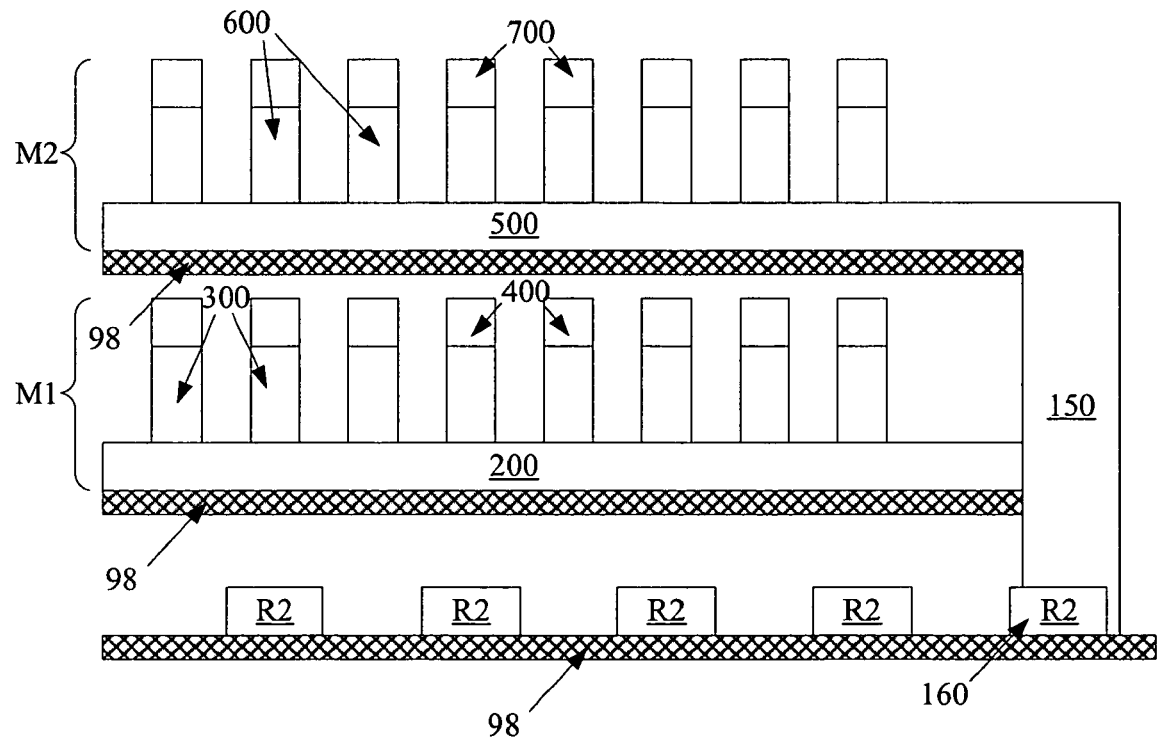
FIG. 9 is a cross-sectional view illustrating electrical connections formed between conductors in a monolithic three dimensional memory array in which another embodiment of the present invention is used to prevent overetch.

Turning to FIG. 9, if desired the methods of the present invention can be used at other points in the pictured array to prevent overetch. If connection is to be made from above to bottom conductors 200 of memory level M1 or to bottom conductors 500 of memory level M2, for example, a dielectric etch stop layer 98, for example of silicon nitride, could be formed immediately underneath each of these sets of conductors. This dielectric etch stop layer 98, if formed of a dielectric material different from the dielectric material covering these conductors 200 and 500, could serve to limit dielectric overetch when an dielectric etch is performed to make contact to them.

Via 150 of FIGS. 8 and 9 connects device levels in a monolithic three dimensional array. What has been described is a method to form such a via, the method comprising forming first conductive features in a first device level above a substrate; forming a first dielectric etch stop layer in contact with the first conductive features; depositing a second dielectric material above the first conductive features; etching a void in the second dielectric material, wherein the etch is selective between the first dielectric material and the second dielectric material, wherein the etch stops on the first dielectric material; exposing a portion of the first conductive features; forming the via within the void, the via making electrical connection to one of the first conductive features; and monolithically forming at least a second device level above the first device level.

In addition to the applications previously incorporated, monolithic three dimensional memory arrays are described in Johnson et al., U.S. Pat. No. 6,034,882, "Vertically Stacked Field Programmable Nonvolatile Memory and Method of Fabrication"; Lee et al., U.S. patent application Ser. No. 09/927,648, "Monolithic Three Dimensional Array of Charge Storage Devices Containing a Planarized Surface," filed Aug. 13, 2001; Walker et al., U.S. patent application Ser. No. 10/335,089, "Method for Fabricating Programmable Memory Array Structures Incoporating Series-Connected Transistor Strings," filed Dec. 31, 2002; Petti et al., U.S. patent application Ser. No. 10/728,230, "Semiconductor Device Including Junction Diode Contacting Contact-Antifuse Unit Comprising Silicide," filed Dec. 3, 2003; and Petti, U.S. patent application Ser. No. 10/955,387, "Fuse Memory Cell Comprising a Diode, the Diode Serving as the Fuse Element," filed Sep. 29, 2004, all hereby incorporated by reference. Where appropriate, the methods of the present invention could be employed in formation of any such memories.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or more memory levels can be formed above the substrate in such a multilevel array.

Many techniques can be used to advantageously arrange electrical connections between memory levels and substrate circuitry in monolithic three dimensional memories. Some of these techniques are described in Scheuerlein et al., U.S. Pat. No. 6,856,572, "Multi-headed decoder structure utilizing memory array line driver with dual purpose driver device"; in Scheuerlein et al., U.S. patent application Ser. No. 10/335,078, "Programmable Memory array Structure Incorporating Series-Connected Transistor Strings and Methods for Fabrication and Operation of Same," filed Dec. 31, 2002; in Scheuerlein et al., U.S. application Ser. No. 10/403,752, "Three-Dimensional Memory Device Incorporating Segmented Bit Line Memory Array," filed Mar. 31, 2003; in Scheuerlein et al., U.S. application Ser. No. 10/403,844, "Word Line Arrangement Having Multi-layer Word Line Segments for Three-Dimensional Memory Array," filed Mar. 31, 2003; in Cleeves et al, U.S. patent application Ser. No. 10/728,437, "Optimization of Critical Dimensions and Pitch of Patterned Features in and Above a Substrate," filed Dec. 5, 2003, and in Scheuerlein et al., U.S. patent application Ser. No. 10/728,451, "High Density Contact to Relaxed Geometry Layers," filed Dec. 5, 2003, all hereby incorporated by reference.

The present invention has been described in the context of a monolithic three dimensional memory array. As will be apparent to those skilled in the art, however, the methods of the present invention can be advantageously used in any context in which dielectric overetch is to be avoided. Clearly the utility of such an approach is in no way limited to memory or to three dimensional devices.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for reducing dielectric overetch, the method comprising:
   depositing a layer or stack of at least semiconductive material;
   patterning and etching the layer or stack of at least semiconductive material to form at least semiconductive features;
   depositing first dielectric fill over and between the at least semiconductive features;
   planarizing to coexpose the first dielectric fill and the at least semiconductive features, forming a substantially planar surface;
   depositing a dielectric etch stop layer directly on the planar surface;
   depositing second dielectric material on the dielectric etch stop layer;
   etching a void in the second dielectric material, wherein the etch is selective between the second dielectric material and the dielectric etch stop layer, wherein the etch stops on the dielectric etch stop layer; and
   etching a portion of the dielectric etch stop layer to expose portions of the at least semiconductive features.

2. The method of claim 1 wherein the dielectric etch stop layer comprises silicon nitride, silicon oxynitride, or silicon carbide.

3. The method of claim 1 wherein the planarizing step is performed by CMP.

4. The method of claim 1 wherein the at least semiconductive features are elements in a monolithic three dimensional memory array.

5. The method of claim 1 wherein the at least semiconductive features are lines.

6. The method of claim 1 wherein the at least semiconductive features comprise a metal.

7. The method of claim 6 wherein the metal is tungsten or a tungsten alloy or compound.

8. A method for reducing dielectric overetch, the method comprising:
   depositing a layer or stack of at least semiconductive material above a substrate;
   patterning and etching the at least semiconductive material to form a plurality of at least semiconductive features separated by gaps;
   filling the gaps with a first dielectric fill;
   planarizing to coexpose the first dielectric fill and at least a portion of the at least semiconductive features, forming a substantially planar surface;
   depositing a second dielectric material directly on the first dielectric fill;
   depositing a third dielectric material above the at least semiconductive features;
   etching a void in the third dielectric material, wherein the etch is selective between the third dielectric material and the second dielectric material and the etch stops on the second dielectric material; and
   exposing a portion of the at least semiconductive features.

9. The method of claim 8 wherein the first dielectric fill and the second dielectric material are the same dielectric material.

10. The method of claim 8 wherein the first dielectric fill and the second dielectric material are not the same dielectric material.

11. The method of claim 8 wherein the second dielectric material is silicon nitride, silicon oxynitride, or silicon carbide.

12. The method of claim 8 wherein the at least semiconductive features are lines.

13. The method of claim 8 wherein, before the step of depositing the third dielectric material, the second dielectric material and the at least semiconductive features are coexposed in a substantially planar surface.

14. The method of claim 8 wherein the second dielectric material is deposited on a substantially planar surface, the substantially planar surface coexposing the first dielectric material and the at least semiconductive features.

15. The method of claim 8 wherein the at least semiconductive features comprise a metal.

16. The method of claim 8 wherein the at least semiconductive features comprise semiconductor material.

17. The method of claim 8 wherein the substrate comprises monocrystalline silicon.

18. The method of claim 8 wherein the at least semiconductive features are elements of a monolithic three dimensional memory array.

19. A method for forming a via connecting device levels in a monolithic three dimensional array, the method comprising:
    forming first conductive features in a first device level above a substrate, wherein the substrate comprises monocrystalline silicon;
    forming a first dielectric etch stop layer in contact with the first conductive features;
    depositing a second dielectric material above the first conductive features;
    etching a void in the second dielectric material, wherein the etch is selective between the first dielectric material and the second dielectric material, wherein the etch stops on the first dielectric material;
    exposing a portion of the first conductive features;
    forming the via within the void, the via making electrical connection to one of the first conductive features; and
    monolithically forming at least a second device level above the first device level.

20. The method of claim 19 wherein the first conductive features comprise a layer or stack of metal or deposited semiconductor material.

21. The method of claim 20 wherein the first conductive features comprise rail-shaped conductors.

22. The method of claim 19 wherein the first device level is a first memory level of memory cells.

23. The method of claim 22 wherein the second device level is a second memory level of memory cells.

24. A method for forming a via connecting device levels in a monolithic three dimensional array, the method comprising:
    forming first conductive features at a first height above a substrate, wherein the substrate comprises monocrystalline silicon;
    forming a first dielectric etch stop layer in contact with the first conductive features;
    depositing a second dielectric material above the first conductive features;
    etching a void in the second dielectric material, wherein the etch is selective between the first dielectric material and the second dielectric material, wherein the etch stops on the first dielectric material;
    exposing a portion of the first conductive features;
    forming the via within the void, the via making electrical connection to one of the first conductive features;
    monolithically forming a first device level at a second height above the first height; and
    monolithically forming a second device level above the first device level.

25. The method of claim 24 wherein the first conductive features comprise a layer or stack of metal or deposited semiconductor material.

26. The method of claim 25 wherein the first conductive features comprise rail-shaped conductors.

27. The method of claim 24 wherein the first device level is a first memory level of memory cells.

28. The method of claim 27 wherein the second device level is a second memory level of memory cells.

29. A method for forming a via connecting device levels in a monolithic three dimensional array, the method comprising:
    forming first conductive features in a first device level above a substrate, wherein the first conductive features comprise rail-shaped conductors formed from a layer or stack of metal or deposited semiconductor material;
    forming a first dielectric etch stop layer in contact with the first conductive features;
    depositing a second dielectric material above the first conductive features;
    etching a void in the second dielectric material, wherein the etch is selective between the first dielectric material and the second dielectric material, wherein the etch stops on the first dielectric material;
    exposing a portion of the first conductive features;
    forming the via within the void, the via making electrical connection to one of the first conductive features; and
    monolithically forming at least a second device level above the first device level.

30. The method of claim 29 wherein the substrate comprises monocrystalline silicon.

31. The method of claim 29 wherein the first device level is a first memory level of memory cells.

32. The method of clam 31 wherein the second device level is a second memory level of memory cells.

33. A method for forming a via connecting device levels in a monolithic three dimensional array, the method comprising:
    forming first conductive features at a first height above a substrate, wherein the first conductive features comprise rail-shaped conductors formed from a layer or stack of metal or deposited semiconductor material;
    forming a first dielectric etch stop layer in contact with the first conductive features;
    depositing a second dielectric material above the first conductive features;
    etching a void in the second dielectric material, wherein the etch is selective between the first dielectric material and the second dielectric material, wherein the etch stops on the first dielectric material;
    exposing a portion of the first conductive features;
    forming the via within the void, the via making electrical connection to one of the first conductive features;
    monolithically forming a first device level at a second height above the first height; and
    monolithically forming a second device level above the first device level.

34. The method of claim 33 wherein the substrate comprises monocrystalline silicon.

35. The method of claim 33 wherein the first device level is a first memory level of memory cells.

36. The method of claim 35 wherein the second device level is a second memory level of memory cells.

* * * * *